(12) United States Patent
Itokawa

(10) Patent No.: US 7,307,854 B2
(45) Date of Patent: Dec. 11, 2007

(54) FLEXIBLE WIRED CIRCUIT BOARD

(75) Inventor: Akinori Itokawa, Osaka (JP)

(73) Assignee: Nitto Denko Corporation (JP)

( * ) Notice: Subject to any disclaimer, the term of this patent is extended or adjusted under 35 U.S.C. 154(b) by 47 days.

(21) Appl. No.: 10/778,167

(22) Filed: Feb. 17, 2004

(65) Prior Publication Data

US 2004/0174663 A1 Sep. 9, 2004

(30) Foreign Application Priority Data

Mar. 3, 2003 (JP) .............................. 2003-055838

(51) Int. Cl.
*H05K 1/11* (2006.01)
*H05K 1/14* (2006.01)

(52) U.S. Cl. ...................... 361/784; 361/749; 361/792; 174/254; 174/258

(58) Field of Classification Search ........ 361/782–784, 361/149–150; 174/254–255; 349/149–152
See application file for complete search history.

(56) References Cited

U.S. PATENT DOCUMENTS

| | | | |
|---|---|---|---|
| 4,806,106 A | * | 2/1989 | Mebane et al. ............... 439/77 |
| 5,042,919 A | * | 8/1991 | Yabu et al. .................. 349/150 |
| 5,091,694 A | * | 2/1992 | Ikeda et al. ................. 324/754 |
| 5,436,745 A | * | 7/1995 | Voisin et al. ................. 349/58 |
| 5,563,619 A | * | 10/1996 | Hilbrink ........................ 345/4 |
| 5,737,053 A | * | 4/1998 | Yomogihara et al. ....... 349/149 |
| 6,057,594 A | * | 5/2000 | Chia et al. .................. 257/668 |
| 6,411,359 B1 | * | 6/2002 | Kobayashi et al. ......... 349/149 |
| 6,424,400 B1 | * | 7/2002 | Kawasaki ................... 349/149 |

FOREIGN PATENT DOCUMENTS

| | | |
|---|---|---|
| JP | H01-303781 | 12/1989 |
| JP | H09-033940 | 2/1997 |
| JP | 2000-124580 | 4/2000 |
| JP | 2001-202029 | 7/2001 |

* cited by examiner

*Primary Examiner*—Tuan T. Dinh
(74) *Attorney, Agent, or Firm*—Akerman Senterfitt; Jean C. Edwards, Esq.

(57) ABSTRACT

A flexible wired circuit board having a fine pitch conductor wiring pattern that can be produced with a high yield rate and improved productivity, includes a first and a second flexible wired circuit board which are disposed to be adjacent to each other on a supporting board so that a first and a second connection terminal are connected to a same electronic component. When a defect occurs in the first flexible wired circuit board in the production process in which the first conductor wiring pattern of the first flexible wired circuit board is formed into the fine pitch, only the defective first flexible wired circuit board can be screened out as a defective product. Thus, the first flexible wired circuit board having no defects can be selected for combination with the second flexible wired circuit board. Thus, the flexible wired circuit board can be produced in a high yield rate.

21 Claims, 5 Drawing Sheets

FIG. 3
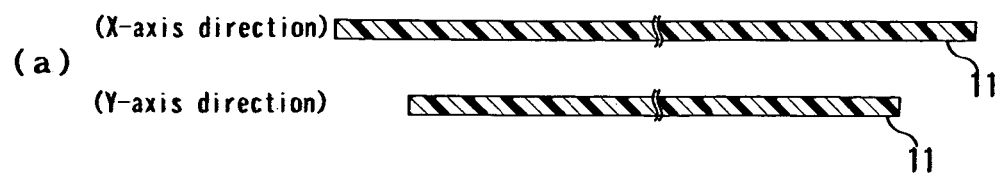
(a)
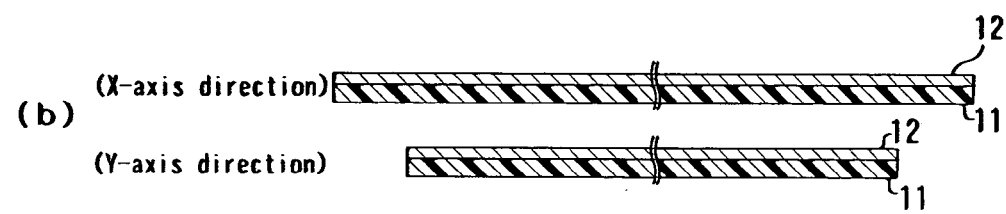
(b)
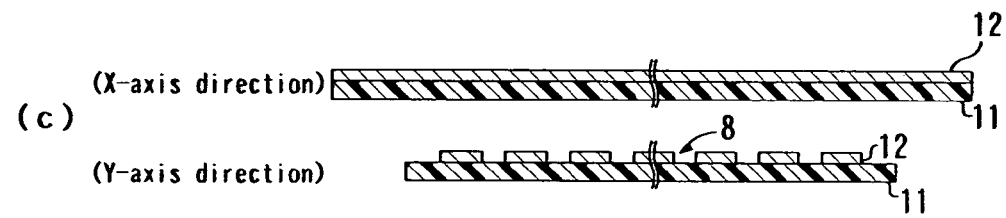
(c)
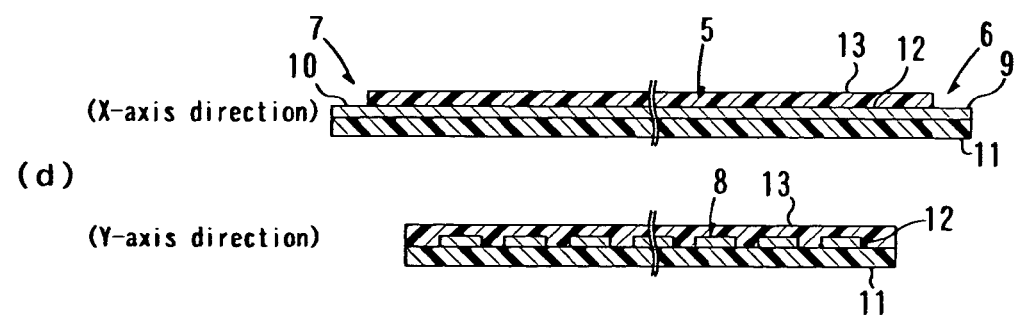
(d)

FLEXIBLE WIRED CIRCUIT BOARD

This application claims priority from Japanese Patent Application No. 2003-055838, filed Mar. 3, 2003, the entire contents of which are herein incorporated by reference to the extent allowed by law.

BACKGROUND OF THE INVENTION

1. Field of the Invention

The present invention relates to a flexible wired circuit board and, more particularly, to a flexible wired circuit board for mounting electronic components thereon.

2. Description of the Prior Art

In recent years, along with the enhancement of high density of electronic components, improvements of the flexible wired circuit board for mounting the electronic components have also been made to have a conductor wiring pattern of finer pitch.

Various attempts have been made for forming a conductor wiring pattern of fine pitch with a high precision. For example, Japanese Laid-open (Unexamined) Patent Publication No. 2000-124580 proposed a method for producing a single-sided flexible printed wiring board in the following steps: (a) a resist pattern corresponding to a wiring pattern is formed on a bottom of a container for forming a polyimide base film, (b) polyamic acid varnish is injected into the container to cover the resist pattern uniformly and then is imidized, whereby a polyimide base film is formed on the resist pattern, (c) the polyimide base film formed on the resist pattern is taken out from the container, (d) the resist pattern is removed from the polyimide base film and a wiring pattern groove is formed in the polyimide base film, and (e) conductive material is disposed in the wiring pattern groove thus formed to thereby form the wiring pattern.

However, this method involves a number of process steps, incurring retardation in improvement of productivity.

Also, along with the progress of the fine-pitch conductor wiring pattern, the conductor wiring pattern is suffering from the disadvantage that defects occur easily, such as, for example, even a minute foreign substance existing between wirings of the conductor wiring pattern may cause a short therebetween easily, causing reduction in yield rates (yielding percentage) of non-defective flexible wired circuit board and eventually causing significant reduction in productivity.

SUMMARY OF THE INVENTION

It is the object of the present invention to provide a flexible wired circuit board with a fine-pitch conductor wiring pattern that can be produced with a high yield rates and improved productivity.

The present invention provides a novel flexible wired circuit board comprising a first flexible wired circuit board having a first connection terminal for connection to an electronic component, a second flexible wired circuit board having a second connection terminal for connection to an electronic component, and a supporting board for supporting the first flexible wired circuit board and the second flexible wired circuit board, wherein the first flexible wired circuit board and the second flexible wired circuit board are disposed to be adjacent to each other on the supporting board so that the first connection terminal and the second connection terminal are connected to a same electronic component.

This flexible wired circuit board is constructed to be segmented in the first flexible wired circuit board and the second flexible wired circuit board. This construction can provide the result that when a defect occurs in the first flexible wired circuit board or the second flexible wired circuit board in the production process in which the conductor wiring pattern is formed at a fine pitch, only the first or the second flexible wired circuit board having the defect can be screened out as a defective product. In other words, the first and the second flexible wired circuit boards having no defects can be selected for combination with each other. Thus, the flexible wired circuit board of the present invention can be produced with a high yield rate and improved productivity, while enabling the conductor wiring pattern to be formed at the fine pitch.

Besides, in the flexible wired circuit board of the present invention, the first flexible wired circuit board and the second flexible wired circuit board are disposed to be adjacent to each other on the supporting board and thereby both flexible wired circuit boards are supported reliably, while also the first connection terminal and the second connection terminal are connected to the same electronic component, and thereby, the first flexible wired circuit board and the second flexible wired circuit board are electrically connected to each other through the same electronic component. This can provide a reduced size of the flexible wired circuit board and can also provide a simplified structure of the same and a reduced number of processes by eliminating the need of the directional connection between the first flexible wired circuit board and the second flexible wired circuit board. In addition to this, this can provide an enhanced reliability of the flexible wired circuit board by putting the first and second flexible wired circuit boards in place steadily on the supporting board.

In the flexible wired circuit board of the present invention, it is preferable that the first flexible wired circuit board and/or the second flexible wired circuit board have/has a conductor wiring pattern formed at a pitch of 150 μm or less.

BRIEF DESCRIPTION OF THE DRAWINGS

In the drawings:

FIG. 3 illustrates in section an embodiment of a production process of a first flexible wired circuit board shown in FIG. 1:

Figure 1:
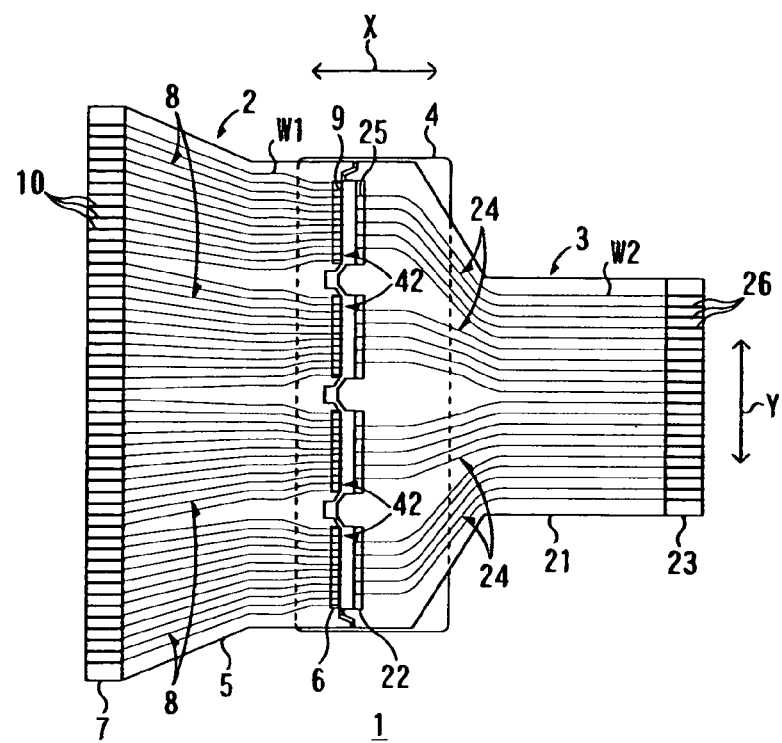
FIG. 1 is a plan view showing an embodiment of a flexible wired circuit board of the present invention.
Figure 4:
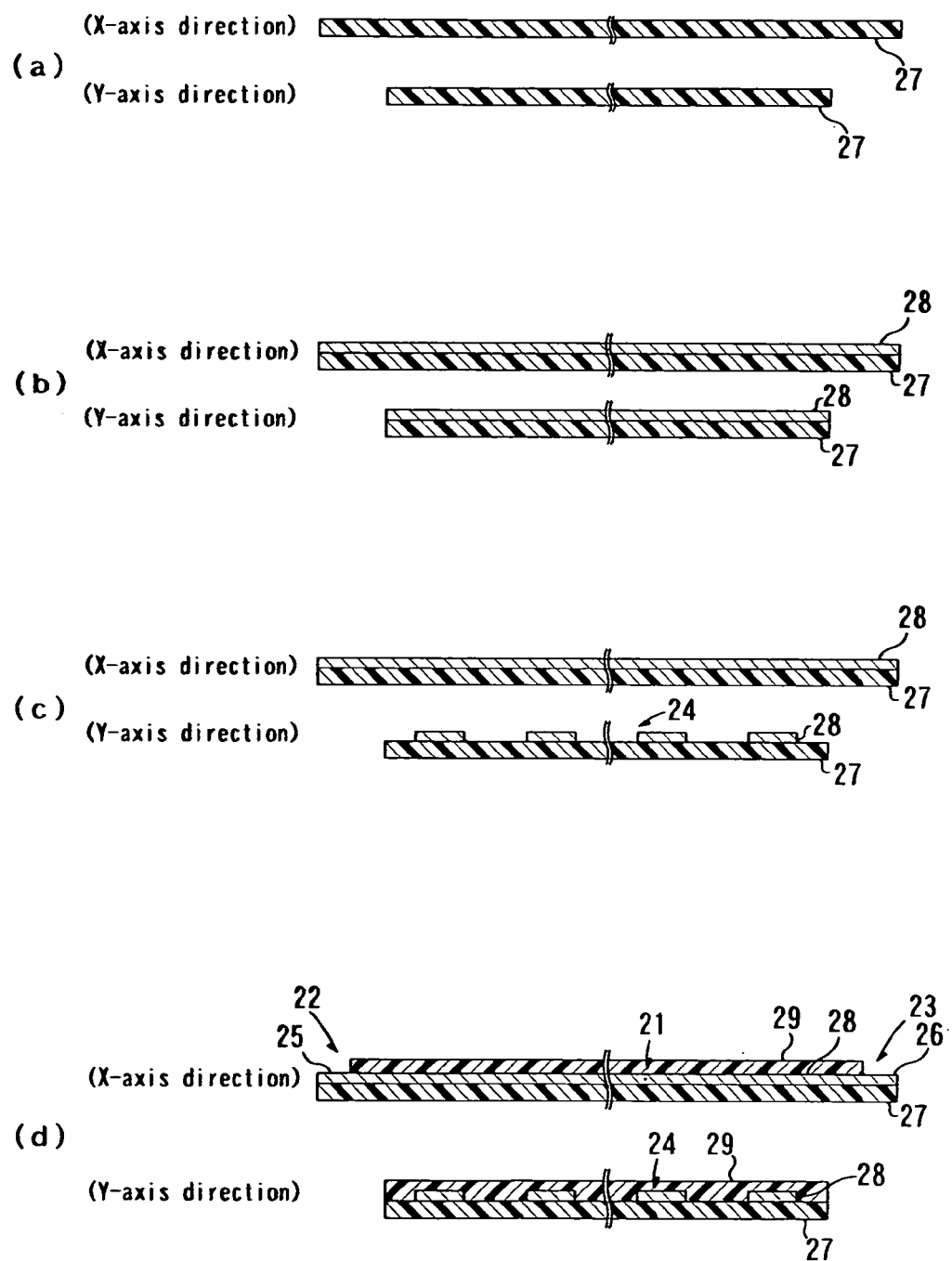
Figure 5:
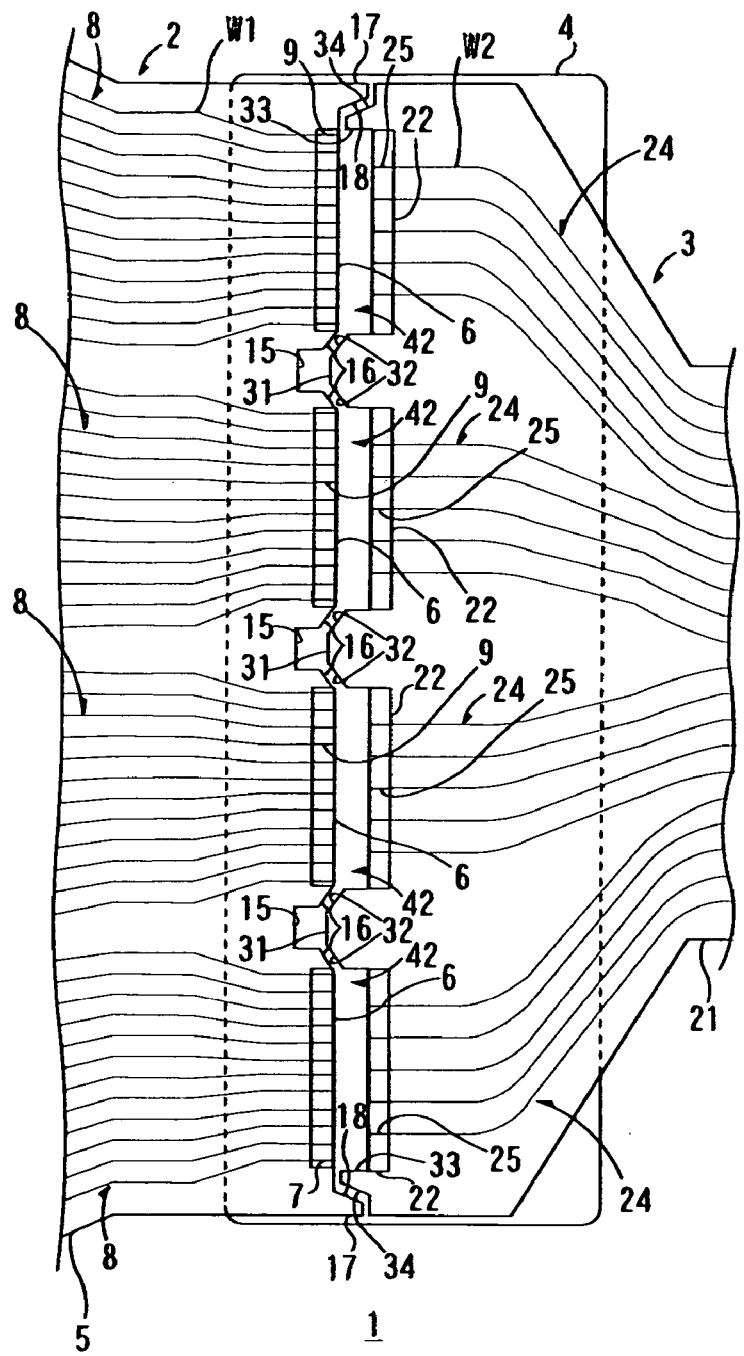
Figure 6:
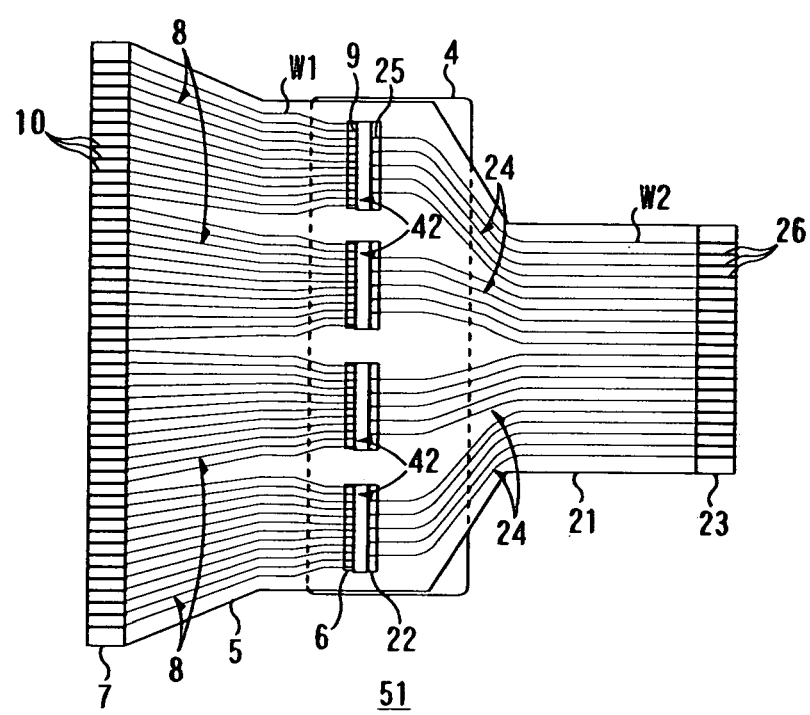

(a) illustrates the process of preparing a first insulating base layer;

(b) illustrates the process of laminating a first conductor layer on the first insulating base layer;

(c) illustrates the process of forming the first conductor layer into a first conductive wiring pattern; and (d) illustrates the process of forming a first insulating cover layer on the first insulating base layer including the first conductor layer, FIG. 4 illustrates in section an embodiment of a production process of a second flexible wired circuit board of the flexible wired circuit board shown in FIG. 1:

(a) illustrates the process of preparing a second insulating base layer;

(b) illustrates the process of laminating a second conductor layer on the second insulating base layer;

(c) illustrates the process of forming the second conductor layer into a second conductive wiring pattern; and (d) illustrates the process of forming a second insulating cover layer on the second insulating base layer including the second conductor layer, FIG. 5 is a plan view of a principal part of the flexible wired circuit board shown in FIG. 1, and FIG. 6 is a plan view showing an integral-type flexible wired circuit board.

DETAILED DESCRIPTION OF THE PREFERRED EMBODIMENT

Figure 2:
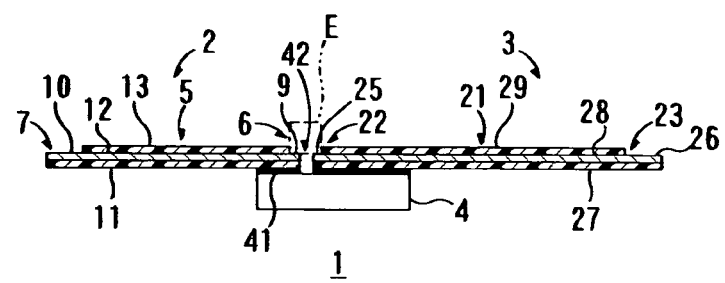
FIG. 2 is a sectional side view of the flexible wired circuit board shown in FIG. 1.

Referring to FIGS. 1 and 2, there are shown a plan view showing an embodiment of a flexible wired circuit board of the present invention and a sectional side view of the same, respectively.

In FIGS. 1 and 2, the flexible wired circuit board 1, which is used for e.g. a flat-panel display, comprises a first flexible wired circuit board 2, a second flexible wired circuit board 3 formed as a separate member from the first flexible wired circuit board 2, and a supporting board 4.

The first flexible wired circuit board 2 comprises a flexible film and has a generally trapezoid form as viewed from the top, as shown in FIG. 1. It comprises a first conductor wiring pattern portion 5, and a first inner terminal portion 6 and a first outer terminal portion 7 which are formed continuously from both sides of the first conductor wiring pattern portion 5, respectively.

Several blocks of (four blocks of) first conductor wiring patterns 8, each comprising a number of wirings W1 arranged in parallel at a fine pitch, are formed on the first conductor wiring pattern portion 5. The pitch distance between the wirings (a total of a width of the wiring W1 and a distance between two adjacent wirings W1) in each of the first conductor wiring patterns 8 is usually in the range of 150 μm or less, or preferably 100 μm or less, and usually 20 μm or more. It is preferable that the width of the wiring W1 in each of the first conductor wiring patterns 8 is in the range of 10-80 μm and the distance between two adjacent wirings W1 is in the range of 10-80 μm.

Several (four) first inner terminal portions 6 are formed at inner ends of the first flexible wired circuit board 2 (at the ends on the side confronting to the second flexible wired circuit board 3) with respect to an extending direction of the wirings W1 of the first conductor wiring patterns 8 (hereinafter it is referred to as "the longitudinal direction"), to extend along a widthwise direction (or along a direction orthogonal to the longitudinal direction). These four first inner terminal portions 6 are formed corresponding to the four blocks of first conductor wiring patterns 8. The first inner terminal portions 6 each have first inner terminals 9 serving as first connection terminals which are formed by exposing the wirings W1 of the first conductor wiring patterns 8 from a first insulating cover layer 13, mentioned later, at their longitudinal inner ends. The first inner terminals 9 are arranged in parallel along the widthwise direction and spaced apart from each other at a predetermined distance. The first inner terminals 9 are connected to electronic components E mentioned later.

As shown in FIG. 5, the first flexible wired circuit board 2 has longitudinally outwardly concaved recessed portions 15 at a longitudinal inner end portion thereof. Each recessed portion 15 is formed between first inner terminal portions 6 adjacent to each other in the widthwise direction. The each recessed portion 15 has, at both widthwise sides thereof on the opening side, slant portions 16 formed to be gradually expanded from the longitudinally outward portion to the longitudinally inner portion.

The first flexible wired circuit board 2 has longitudinally inwardly projected projections 17 formed at longitudinal inner ends thereof on both widthwise sides (between the first inner terminal portions 6 located at the widthwise outermost sides and both widthwise outer ends of the first flexible wired circuit board 2). Each of the projections 17 has, at a widthwise inner portion thereof, a slant portion 18 which is gradually narrowed toward the longitudinal inner end.

As shown in FIG. 1, the first outer terminal portion 7 is disposed at a longitudinal outer end of the first flexible wired circuit board 2 (at an end of the side opposite from the end confronting to the second flexible wired circuit board 3) and is formed to extend continuously over the entire width. The first outer terminal portion 7 is provided with the first outer terminals 10 arranged in parallel along the widthwise direction and spaced apart from each other at a predetermined distance. The first outer terminals 10 are formed by exposing the wirings W1 of the first conductor wiring patterns 8 from the first insulating cover layer 13, mentioned later, at their longitudinal outer ends. The first outer terminals 10 are connected, for example, to a flat-panel display and the like.

The total number of first inner terminals 9 in the first inner terminal portions 6 is equal to the total number of first outer terminals 10 in the first outer terminal portions 7. For example, terminals 9, 10 of the order of 100-1,000 in total are formed in their respective terminal portions, though no particular limitation is imposed thereon.

As shown in FIG. 2, the first flexible wired circuit board 2 comprises a first insulating base layer 11, a first conductor layer 12 formed on a front surface of the first insulating base layer 11, and a first insulating cover layer 13 covering the first conductor layer 12.

The material of the first insulating base layer 11 is not limited to any particular material, as long as it has insulating properties and flexibility. The materials that may be used for the first insulating base layer 11 include, for example, synthetic resins, such as polyimide resin, acrylic resin, polyether nitrile resin, polyether sulfonic resin, polyethylene terephthalate resin, polyethylene naphthalate resin and polyvinyl chloride resin. A polyimide resin film is preferably used. It is preferable that the first insulating base layer 11 usually has a thickness of 10-200 μm, or preferably 10-75 μm.

The material of the first conductor layer 12 is not limited to any particular material, as long as it has conducting properties. The materials used for the conductor layer 12 include, for example, metal foils, such as copper, chromium, nickel, aluminum, stainless steel, copper-beryllium, phosphor bronze, iron-nickel, or alloys thereof. Copper foil is preferably used for the first conductor layer 12. It is preferable that the first conductor layer 12 usually has a thickness of 5-100 μm, or preferably 5-18 μm.

The same material as the material used for the first insulating base layer 11 is used for the first insulating cover layer 13. Polyimide resin is preferably used for the first insulating cover layer 13. It is preferable that the first insulating cover layer 13 usually has a thickness of 10-200 μm, or preferably 10-75 μm.

The first flexible wired circuit board 2 can be produced, for example, by a known process shown in FIG. 3, without limiting to any particular process. In FIG. 3, sectional views taken along a longitudinal direction of the wiring W1 of the first conductor wiring pattern 8 are represented as sectional side views as viewed from "the X-axis direction" (the direction indicated by an arrow X of FIG. 1), and sectional views taken along a widthwise direction of the first flexible wired circuit board 2 is represented as sectional front views as viewed from "the Y-axis direction" (the direction indicated by an arrow Y of FIG. 1).

In the process shown in FIG. 3, the first insulating base layer 11 is prepared, first, as shown in FIG. 3(a), and then the first conductor layer 12 is laminated on the first insulating base layer 11, as shown in FIG. 3(b). No particular limitation is imposed on the process of laminating the first conductor layer 12 on the first insulating base layer 11. For example, any one of the following three processes may be taken for laminating the first conductor layer 12 on the first insulating base layer 11: (1) a metal foil of the first conductor layer 12 is adhesively bonded to a film of the first insulating layer 11 through a known adhesive layer (not shown) interposed therebetween; (2) the first insulating base layer 11 is formed directly on a metal foil of the first conductor layer 12 on which resin solution was applied and dried; and (3) an adhesive film of the first insulating base layer 11 is bonded directly to the surface of the metal foil of the first conductor layer 12, without any adhesive layer interposed therebetween. If the adhesive layer is interposed between the first insulating base layer 11 and the first conductor layer 12, it preferably has a thickness of 10-35 μm.

This process may be eliminated by using a two-layer substrate formed by previously laminating the first conductor layer 12 on the first insulating base layer 11.

Sequentially, the first conductor layer 12 is patterned to form the first conductor wiring pattern 8, as shown in FIG. 3(c). The patterning of the first conductor layer 12 may be made by a known patterning process, such as a subtractive process. In the subtractive process, an etching resist comprising a photoresist or equivalent is laminated on the first conductor layer 12, first. Then, the etching resist is exposed to light and developed to form a pattern corresponding to the first conductor wiring pattern 8. Thereafter, with the etching resist as a resist, the first conductor layer 12 is etched (wet-etched). Thereafter, the etching resist is removed.

Alternatively, the patterning of the first conductor layer 12 may be made by other known patterning process than the subtractive process, such as an additive process or a semi-additive process, depending on its intended purpose and use application.

Then, the first insulating cover layer 13 is formed on the first insulating base layer 11 to cover the first conductor layer 12, as shown in FIG. 3(d), thereby producing the first flexible wired circuit board 2.

No particular limitation is imposed on the process of forming the first insulating cover layer 13. For example, any one of the following three processes may be taken for laminating the first insulating cover layer 13 on the first insulating base layer 11 including the first conductor layer 12: (1) a film of the first insulating cover layer 13 is adhesively bonded onto the first insulating layer 11 including the first conductor layer 12 through a known adhesive layer (not shown) interposed therebetween; (2) the first insulating cover layer 13 is formed directly on the first insulating base layer 11 including the first conductor layer 12 on which resin solution was applied and dried; and (3) an adhesive film of the first insulating cover layer 13 is bonded directly to the surface of the first insulating base layer 11 including the first conductor layer 12, without any adhesive layer interposed therebetween. If the adhesive layer is interposed between the first insulating cover layer 13 and the first insulating base layer 11 including the first conductor layer 12, it preferably has a thickness of 10-35 μm. Yet another process may be used in which photosensitive resin solution, after applied onto the first insulating base layer 11 including the first conductor layer 12, is exposed to light and developed to form the first insulating cover layer 13 into a predetermined pattern on the first insulating base layer 11 including the first conductor layer 12.

In the process of forming the first insulating cover layer 13, the first conductor wiring pattern 8 is exposed at both longitudinal end portions thereof (longitudinally inner and outer end portions) without forming the first insulating cover layer 13 on the first conductor wiring pattern 8, to form the first inner terminals 9 and the first outer terminals 10 thereat. The areas where the respective terminals are exposed are defined herein as the first inner terminal portion 6 and the first outer terminal portion 7, respectively.

To be more specific, when the first inner terminal portion 6 and the first outer terminal portion 7 are formed, for example, by patterning the photosensitive resin, the respective terminal portions 6 and 7 may be formed at the same time as the first insulating cover layer 13 is formed. On the other hand, when the resin solution is applied to the entire area of the first insulating cover layer 13 or when a film of the first insulting cover layer 13 is adhesively bonded to the first conductor wiring pattern 8, the respective terminal portions 6 and 7 may be formed by opening both longitudinal end portions of the first insulating cover layer 13 by the any known method, such as drilling, punching, laser machining, and etching.

The second flexible wired circuit board 3 comprises a flexible film having a generally T-shape as viewed from the top, as shown in FIG. 1. It comprises a second conductor wiring pattern portion 21, and a second inner terminal portion 22 and a second outer terminal portion 23 which are formed continuously from both sides of the second conductor wiring pattern portion 21, respectively.

Several blocks of (four blocks of) second conductor wiring patterns 24, each comprising a number of wirings W2 arranged in parallel at a pitch rougher than the pitch of the wirings W1 of the first conductor wiring pattern 8, are formed on the second conductor wiring pattern portion 21. The pitch distance between the wirings (a total of a width of the wiring W2 and a distance between two adjacent wirings W2) in each of the second conductor wiring patterns 24 is usually in the range of 80-500 μm, or preferably 80-200 μm. It is preferable that the width of the wiring W2 in each of the second conductor wiring patterns 24 is in the range of 40-100 μm and the distance between two adjacent wirings W2 is in the range of 40-100 μm.

Several (four) second inner terminal portions 22 are formed at inner ends of the second flexible wired circuit board 3 (at the ends on the side confronting to the first flexible wired circuit board 2) with respect to an extending direction of the wirings W2 of the second conductor wiring patterns 24 (hereinafter it is referred to as "the longitudinal direction"), to extend along a widthwise direction (or along a direction orthogonal to the longitudinal direction). These four second inner terminal portions 22 are formed corresponding to the four blocks of second conductor wiring patterns 24. The second inner terminal portions 22 each have second inner terminals 25 serving as second connection terminals which are formed by exposing the wirings W2 of the second conductor wiring patterns 24 from a second insulating cover layer 29, mentioned later, at their longitudinal inner ends. The second inner terminals 25 are arranged in parallel along the widthwise direction and spaced apart from each other at a predetermined distance. The second inner terminals 25 are connected to electronic components E mentioned later.

As shown in FIG. 5, the second flexible wired circuit board 3 has longitudinally inwardly projected convex portions 31 at a longitudinal inner end portion thereof Each convex portion 31 is formed between second inner terminal portions 22 adjacent to each other in the widthwise direction. The each convex portion 31 has, at both widthwise sides thereof on the projection side, slant portions 32 formed to be gradually narrowed from the longitudinally outward portion to the longitudinally inner portion.

The second flexible wired circuit board 3 has longitudinally inwardly projected projections 33 formed at longitudinal inner ends thereof on both widthwise sides (between the second inner terminal portions 22 located at the widthwise outermost sides and both widthwise outer ends of the second flexible wired circuit board 3). Each of the projections 33 has, at a widthwise outer portion thereof, a slant portion 34 which is gradually narrowed toward the longitudinal inner end.

As shown in FIG. 1, the second outer terminal portion 23 is disposed at a longitudinal outer end of the second conductor wiring pattern 24 (at an end of the side opposite from the end confronting to the first flexible wired circuit board 2) and is formed to extend continuously over the entire width. The second outer terminal portion 23 is provided with the second outer terminals 26 arranged in parallel along the widthwise direction and spaced apart from each other at a predetermined distance. The second outer terminals 23 are formed by exposing the wirings W2 of the second conductor wiring patterns 24 from the second insulating cover layer 29, mentioned later, at their longitudinal outer ends. The second outer terminals 26 are connected, for example, to an external circuit such as a controlling circuit.

The total number of second inner terminals 25 in the second inner terminal portions 22 is equal to the total number of second outer terminals 26 in the second outer terminal portions 23. For example, terminals 25, 26 of the order of 1-100 in total are formed in their respective terminal portions, though no particular limitation is imposed thereon.

As shown in FIG. 2, the second flexible wired circuit board 3 comprises a second insulating base layer 27, a second conductor layer 28 formed on a front surface of the second insulating base layer 27, and a second insulating cover layer 29, mentioned later, covering the second conductor layer 28, as is the case with the first flexible wired circuit board 2.

The materials of the second insulating base layer 27 and the second insulating cover layer 29 are not limited to any particular materials, as long as they have insulating properties and flexibility. The same materials as the material of the first insulating base layer 11 may be used. A polyimide resin film is preferably used for the second insulating base layer 27 and the second insulating cover layer 29. It is preferable that the second insulating base layer 27 usually has a thickness of 10-200 μm, or preferably 10-75 μm, and the second insulating cover layer 29 usually has a thickness of 10-200 μm, or preferably 10-75 μm.

The material of the second conductor layer 28 is not limited to any particular material, as long as it has conducting properties. The same metal foil as that of the first conductor layer 12 may be used for the second conductor layer 28. Copper foil is preferably used for the second conductor layer 28. It is preferable that the second conductor layer 28 usually has a thickness of 5-100 μm, or preferably 5-18 μm.

The second flexible wired circuit board 3 can be produced, for example, by a known process shown in FIG. 4, without limiting to any particular process, as is the case with the first flexible wired circuit board 2. In FIG. 4, sectional views taken along the longitudinal direction of the wiring W2 of the second conductor wiring pattern 24 are represented as sectional side views as viewed from "the X-axis direction" (the direction indicated by the arrow X of FIG. 1), and sectional views taken along a widthwise direction of the second flexible wired circuit board 3 are represented as sectional front views as viewed from "the Y-axis direction" (the direction indicated by the arrow Y of FIG. 1).

In the process shown in FIG. 4, the second insulating base layer 27 is prepared, first, as shown in FIG. 4(a), and then the second conductor layer 28 is laminated on the second insulating base layer 27, as shown in FIG. 4(b). The same process as the process for laminating the first conductor layer 12 on the first insulating base layer 11 is used for laminating the second conductor layer 28 on the second insulating base layer 27.

Sequentially, the second conductor layer 28 is patterned to form the second conductor wiring pattern 24, as shown in FIG. 4(c). The patterning of the second conductor layer 28 may be made by a known patterning process, such as a subtractive process, as in the case of the first conductor layer 12. Alternatively, the patterning of the second conductor layer 28 may be made by other known patterning process than the subtractive process, such as an additive process or a semi-additive process, depending on its intended purpose and use application.

Then, the second insulating cover layer 29 is formed on the second insulating base layer 27 to cover the second conductor layer 28, as shown in FIG. 4(d), thereby producing the second flexible wired circuit board 3.

The same process as the process of forming the first insulating cover layer 13 is used for forming the second insulating cover layer 29.

In the process of forming the second insulating cover layer 29, the second conductor wiring pattern 24 is exposed at both longitudinal end portions thereof (longitudinally inner and outer end portions) without forming the second insulating cover layer 29 on the second conductor wiring pattern 24, to form the second inner terminals 25 and the second outer terminals 26 thereat. The areas where the respective terminals are exposed are defined herein as the second inner terminal portion 22 and the second outer terminal portion 23, respectively. The same process as the process of forming the first inner terminal portion 6 and the first outer terminal portion 7 is used for forming the second inner terminal portion 22 and the second outer terminal portion 23.

In the flexible wired circuit board 1, the first flexible wired circuit board 2 and second flexible wired circuit board 3 thus produced are mounted to be adjacent to each other on the supporting board 4 so that the first inner terminals 9 of their respective first inner terminal portions 6 and the second inner terminals 25 of their respective second inner terminal portions 22 can be connected to the same (common) electronic component E, as shown in FIG. 5.

The supporting board 4 has a generally rectangular form having substantially the same width as the width of the longitudinally inner end portion of the first flexible wired circuit board 2 and the width of the longitudinally inner end portion of the second flexible wired circuit board 3. Although no particular limitation is imposed on the material of the supporting board 4, the materials that may be used for the supporting board 4 include, for example, metal sheets, such as an aluminum sheet and a stainless steel sheet, fiber-reinforced resins, such as a glass-epoxy sheet, and resin sheets, such as a polyimide sheet and a polyethylene terephthalate (PET) sheet. The metal sheets, such as the aluminum sheet and the stainless steel sheet, are preferably used in terms of improvement in connection reliability of the electronic component E. The thickness of the supporting board 4 is usually in the range of 50 μm-4 mm.

The first flexible wired circuit board 2 and the second flexible wired circuit board 3 are mounted to be adjacent to each other on the supporting board 4 so that the first inner terminals 9 of their respective first inner terminal portions 6 and the second inner terminals 25 of their respective second inner terminal portions 22 can be connected to the same electronic component E. To be more specific, the first flexible wired circuit board 2 and the second flexible wired circuit board 3 are disposed in abutment with each other on the supporting board 4, so that the slant portions 16 of the respective recessed portions 15 of the first flexible wired circuit board 2 and the slant portions 32 of the respective convex portions 31 of the second flexible wired circuit board 3 are disposed opposite to each other with slight clearances and also the slant portions 18 of the respective projections 17 of the first flexible wired circuit board 2 and the slant portions 34 of the respective projections 33 of the second flexible wired circuit board 3 are disposed opposite to each other with slight clearances, and also the first flexible wired circuit board 2 and the second flexible wired circuit board 3 are adhesively bonded onto the supporting board 4 through the adhesive layer 41, as shown in FIG. 2.

When the first flexible wired circuit board 2 and the second flexible wired circuit board 3 are disposed in abutment with each other in the manner as mentioned above, the first inner terminals 9 of their respective first inner terminal portions 6 and the second inner terminals 25 of their respective second inner terminal portions 22 can be positioned to be connected to the same electronic component E in a simple and reliable way, while the first flexible wired circuit board 2 and the second flexible wired circuit board 3 are put in place on the supporting board 4.

The adhesive for forming the adhesive layer 41 is not limited to any particular adhesive. Known adhesives, such as epoxy adhesive and polyimide adhesive, may be used for the adhesive layer 41. The thickness of the adhesive layer 41 is usually in the range of 10-100 μm, or preferably 10-50 μm.

The first flexible wired circuit board 2 and the second flexible wired circuit board 3 may be adhesively bonded to the supporting board 4 through the adhesive layer 41 in the following way, though no particular limitation is imposed thereon. That is to say, after the adhesive is applied to the inner end portion of the first insulating base layer 11 of the first flexible wired circuit board 2 and the inner end portion of the second insulating base layer 27 of the second flexible wired circuit board 3, the first flexible wired circuit board 2 and the second flexile wired circuit board 3 to which the adhesive was applied are adhesively bonded to the supporting board 4, or after the adhesive is applied to a front surface of the supporting board 4, the inner end portion of the first insulating base layer 11 of the first flexible wired circuit board 2 and the inner end portion of the second insulating base layer 27 of the second flexible wired circuit board 3 are adhesively bonded to the front surface of the supporting board 4 to which the adhesive was applied. The former way is illustrated in FIG. 2.

As a result of this, the respective first inner terminal portions 6 of the first flexible wired circuit board 2 and the respective second inner terminal portions 22 of the second flexible wired circuit board 3 are disposed opposite to each other at a predetermined distance. The space sandwiched between the terminal portions 6, 22 and formed in a generally rectangular shape when viewed from the top serves as the electronic component mounting portion 42 for mounting the electronic components E.

As seen from the above, the flexible wired circuit board 1 is constructed to be segmented in the first flexible wired circuit board 2 and the second flexible wired circuit board 3 which are disposed opposite to each other, with the electronic component mounting portion 42 sandwiched therebetween. This construction can provide the result that for example when a defect incurs in the first flexible wired circuit board 2 in the production process in which the first conductor wiring pattern 8 of the first flexible wired circuit board 2 is formed into the fine pitch, only the first flexible wired circuit board 2 having the defect can be screened out as a defective product, in other words, the first flexible wired circuit board 2 having no defects can be selected for combination with the second flexible wired circuit board 3.

For example, in an integral-type flexible wired circuit board 51 having the electronic component mounting portion 42 formed by punching, as shown in FIG. 6, a defect resulting from the fine pitch of the first conductor wiring pattern 8 will lead to a defective product of the flexible wired circuit board 51 on the whole, thus causing reduction in yield rates (yield percentage) of non-defective flexible wired circuit board and eventually causing significant reduction in productivity. In FIG. 6, the same reference numerals refer to corresponding parts of the flexible wired circuit board 1 shown in FIG. 1.

In contrast to this, the flexible wired circuit board 1 of the illustrated embodiment is a compound type of flexible wired circuit board 1 combining the first flexible wired circuit board 2 and the second flexible wired circuit board 3 which are provided separately from each other. This enables the non-defective first flexible wired circuit board 2 having the first conductor wiring pattern 8 formed at a fine pitch to be always combined with the second flexible wired circuit board 3. Thus, the flexible wired circuit board 1 can be produced in a high yield rates of non-defective flexible wired circuit board and with improved productivity on the whole.

Then, the electronic component E is mounted on the electronic component mounting portion 42 of the flexible wired circuit board 1 thus produced, as indicated by a phantom line of FIG. 2.

The electronic component E is properly selected from those including, for example, semiconductor chip, condenser, and resistor, in accordance with its intended purpose and use application and is mounted on the flexible wired circuit board 1 in the following manner. For example, the electronic components E are put in place on their respective electronic component mounting portions 42 and, then, the first inner terminals 9 of the first flexible wired circuit board 2 and the second inner terminals 25 of the second flexible wired circuit board 3 are connected to each other by a known connecting method, such as a wire bonding, an antisotropic conductive interconnection using antisotropic conductive adhesive, or a solder connection, whereby the electronic components E are mounted on the flexible wired circuit board 1.

In this flexible wired circuit board 1, the first flexible wired circuit board 2 and the second flexible wired circuit board 3 are disposed to be adjacent to each other on the supporting board 4 and are supported thereon reliably, while also the first inner terminals 9 of the respective first inner terminal portions 6 and the second inner terminals 25 of the respective second inner terminal portions 22, which are disposed opposite to each other, are connected to the same (common) electronic components E. This construction enables the first flexible wired circuit board 2 and the second flexible wired circuit board 3 to be electrically connected to each other through the electronic components E. This can provide a reduced size of the flexible wired circuit board 1 and can also provide a simplified structure of the same and a reduced number of processes by eliminating the need of the directional connection between the first flexible wired circuit board 2 and the second flexible wired circuit board 3. In addition to this, this can provide an enhanced reliability of the flexible wired circuit board 1 by putting the first and second flexible wired circuit boards 2, 3 in place steadily on the supporting board 4.

After the electronic components E are mounted, the supporting board 4 may be eliminated, if not needed.

Although the construction wherein the first conductor wiring pattern 8 of the first flexible wired circuit board 2 are formed into the fine pitch, while on the other hand, the second conductor wiring pattern 24 of the second flexible wired circuit board 3 are formed into the pitch rougher than the fine pitch of the first conductor wiring pattern 8 has been described above, the flexible wired circuit board of the present invention may be modified to have a reversed construction. That is to say, the second conductor wiring pattern 24 of the second flexible wired circuit board 3 are formed into the fine pitch, while on the other hand, the first conductor wiring pattern 8 of the first flexible wired circuit board 2 are formed into the pitch rougher than the fine pitch of the second conductor wiring pattern 24. Further, the first conductor wiring pattern 8 of the first flexible wired circuit board 2 and the second conductor wiring pattern 24 of the second flexible wired circuit board 3 may both be formed into the fine pitch of e.g. 150 μm or less.

Although the construction wherein the total number of first inner terminals 9 (e.g. the order of 100-1,000) in the first inner terminal portions 6 of the first flexible wired circuit board 2 is made larger than the total number of second inner terminals 25 (e.g. the order of 1-100) in the second inner terminal portions 22 of the second flexible wired circuit board 3 has been described above, no particular limitation is imposed on the number of terminals. For example, the total number of first inner terminals 9 and the total number of second inner terminals 25 may be equal to or different from each other.

Also, although the construction wherein the first flexible wired circuit board 2 and the second flexible wired circuit board 3 are electrically connected to each other through the electronic components E has been described above, the first flexible wired circuit board 2 and the second flexible wired circuit board 3 may be electrically connected to each other through other connecting wirings, for example, by the wire bonding, if necessary.

EXAMPLE

While in the following, the present invention will be described in further detail with reference to Example, the present invention is not limited to the Example.

Example 1

1) Production of First Flexible Wired Circuit Board

First, a two-layer substrate was prepared, comprising a first insulating base layer comprising a polyimide resin film having a thickness of 25 μm and a first conductor layer comprising a copper foil having a thickness of 18 μm which were laminated directly with each other (See FIG. 3(b)).

Then, the first conductor layer was formed into a first conductor wiring pattern (of 75 μm in width of wiring, 50 μm in spacing, 125 μm in pitch, and 400 in total number of first inner/outer terminals) by the subtractive process (See FIG. 3(c)).

Thereafter, the first insulating cover layer comprising a polyimide resin film having a thickness of 25 μm and previously punched into a shape to expose the first inner terminals and the first outer terminals was adhesively bonded to the first insulating base layer including the first conductor layer through an adhesive layer comprising an epoxy resin of a thickness of 15 μm, to thereby produce the first flexible wired circuit board (FIG. 3(d)). This first flexible wired circuit board is identical in detailed shape to the first flexible wired circuit board shown in FIG. 1.

2) Production of Second Flexible Wired Circuit Board

First, a two-layer substrate was prepared, comprising a second insulating base layer comprising a polyimide resin film having a thickness of 25 μm and a second conductor layer comprising a copper foil having a thickness of 18 μm which were laminated directly with each other (See FIG. 4(b)).

Then, the second conductor layer was formed into a second conductor wiring pattern (of 100 μm in width of wiring, 100 μm in spacing, 200 μm in pitch, and 25 in total number of second inner/outer terminals) by the subtractive process (See FIG. 4(c)).

Thereafter, the second insulating cover layer comprising a polyimide resin film having a thickness of 25 μm and previously punched into a shape to expose the second inner terminals and the second outer terminals was adhesively bonded onto the second insulating base layer including the second conductor layer through an adhesive layer comprising an epoxy resin of a thickness of 15 μm, to thereby produce the second flexible wired circuit board. This second flexible wired circuit board is identical in detailed shape to the second flexible wired circuit board shown in FIG. 1.

3) Production of Compound Type of Flexible Wired Circuit Board

An aluminum plate of 100 mm long, 30 mm wide, and 2 mm thick was prepared as a supporting board and, then, epoxy adhesive was applied in a thickness of 50 μm to the inner end portion of the first insulating base layer of the first flexible wired circuit board obtained and to the inner end portion of the second insulating base layer of the second flexible wired circuit board. Then, the first and second flexible wired circuit boards were disposed in abutment with each other on the supporting board (See FIG. 5), so that slant portions of the respective recessed portions of the first flexible wired circuit board and slant portions of the respective convex portions of the second flexible wired circuit board were disposed opposite to each other with slight clearances and also the slant portions of the respective projections of the first flexible wired circuit board and the slant portions the projections of the second flexible wired circuit board were disposed opposite to each other with slight clearances, and also the first flexible wired circuit board and the second flexible wired circuit board were adhesively bonded onto the supporting board (See FIG. 2), thereby producing the compound type of flexible wired circuit board (See FIG. 1).

What is claimed is:

1. A flexible wired circuit board assembly comprising:
a supporting board;
a first flexible wired circuit board, comprising:
a first insulating layer having an end portion that is coupled to the supporting board and having a substantial length that is not coupled to the supporting board;

a first conductor wiring pattern that is formed on the first insulating layer; and first connection terminal portions that are coupled to the first conductor wiring pattern for connection to an electronic component; and a plurality of longitudinally outwardly concave recessed portions disposed between adjacent first connection terminal portions; and a second flexible wired circuit board, comprising:

a second insulating layer having an end portion that is coupled to the supporting board and having a substantial length that is not coupled to the supporting board;

a second conductor wiring pattern that is formed on the second insulating layer; and second connection terminal portions that are coupled to the second conductor wiring pattern for connection to the electronic component, the second flexible wired circuit board being formed as a separate member from the first flexible wired circuit board and being disposed in abutment with the first flexible wired circuit board and wherein the first flexible wired circuit board and the second flexible wired circuit board are disposed to be adjacent to each other on the supporting board so that the first connection terminal and the second connection terminal are connected to a same electronic component.

2. The flexible wired circuit board assembly according to claim 1, wherein at least one of the first conductor wiring pattern and the second wiring pattern are formed at a pitch of 150 μm or less.

3. The flexible wired circuit board assembly according to claim 1, further comprising:

a plurality of inner terminal portions that are disposed at a longitudinal end of at least one of each of said first flexible wired circuit board and said second flexible wired circuit board, said inner terminal portions having inner terminals serving as connection terminals, said inner terminals being arranged in parallel along a widthwise direction and spaced apart from one another at a predetermined distance;

wherein the inner terminals connect to said at least one of said first flexible wired circuit board and said second flexible wired circuit board.

4. The flexible wired circuit board assembly according to claim 1, further comprising:

an outer terminal portion disposed at a longitudinal outer end of at least one of said first flexible wired circuit board and said second flexible wired circuit board.

5. The flexible wired circuit board assembly according to claim 1, wherein said supporting board has substantially a same width as a width of at least one of a longitudinally inner end portion of said first flexible wired circuit board and said second flexible wired circuit board.

6. The flexible wired circuit board assembly according to claim 1, wherein said first flexible wired circuit board and said second flexible wired circuit board are disposed opposite to each other with said electronic component sandwiched therebetween.

7. The flexible wired circuit board assembly according to claim 1, wherein at least one of said first flexible wired circuit board and said second flexible wired circuit board further comprises:

an insulating cover layer covering corresponding ones of the first conductor wiring pattern and the second conductor wiring pattern.

8. The flexible wired circuit board assembly according to claim 1, wherein the second flexible wired circuit board is removable from the first flexible wired circuit board.

9. The flexible wired circuit board assembly according to claim 1, wherein the second flexible wired circuit board further comprises projecting convex portions disposed between adjacent second connection terminal portions.

10. The flexible wired circuit board assembly according to claim 3, wherein said end portion of the first insulating layer of the first flexible wired circuit board and said end portion of the second insulating layer of the second flexible wired circuit board are adhesively bonded to said supporting board.

11. The flexible wired circuit board assembly according to claim 3, wherein said inner terminal portions of said first flexible wired circuit board and said inner terminal portions of said second flexible wired circuit board are disposed opposite to each other at a predetermined distance.

12. A flexible wired circuit board, comprising:

a first flexible wired circuit board having a first connection terminal for connection to an electronic component, a second flexible wired circuit board having a second connection terminal for connection to an electronic component, and a supporting board for supporting the first flexible wired circuit board and the second flexible wired circuit board, wherein the first flexible wired circuit board and the second flexible wired circuit board are disposed to be adjacent to each other on the supporting board so that the first connection terminal and the second connection terminal are connected to a same electronic component; and a plurality of inner terminal portions disposed at a longitudinal end of at least one of each said first flexible wired circuit board and said second flexible wired circuit board, said inner terminal portions having inner terminals serving as connection terminals, said inner terminals being arranged in parallel along a widthwise direction and spaced apart from one another at a predetermined distance;

wherein the inner terminals connect to said at least one of said first flexible wited circuit board and said second flexible wired circuit board; and wherein said first flexible wired circuit board comprises:

a plurality of longitudinally outwardly concaved recessed portions at a longitudinal inner end portion thereof.

13. The flexible wired circuit board according to claim 12, wherein said recessed portions are formed between said inner terminal portions adjacent to each other in said widthwise direction.

14. The flexible wired circuit board according to claim 13, wherein each of said recessed portions includes, at both widthwise sides thereof on an opening side, a plurality of slant portions formed to be gradually expanded from a longitudinally outward portion to a longitudinally inner portion.

15. The flexible wired circuit board according to claim 14, further comprising:

a plurality of longitudinally inwardly projected projections formed at longitudinal inner ends thereof on said both widthwise sides.

16. The flexible wired circuit board according to claim 15, wherein each of said projections includes, at a widthwise inner portion thereof, a slant portion which is gradually narrowed toward a longitudinal inner end.

17. A flexible wired circuit board, comprising:
a first flexible wired circuit board having a first connection terminal for connection to an electronic component,
a second flexible wired circuit board having a second connection terminal for connection to an electronic component, and
a supporting board for supporting the first flexible wired circuit board and the second flexible wired circuit board,
wherein the first flexible wired circuit board and the second flexible wired circuit board are disposed to be adjacent to each other on the supporting board so that the first connection terminal and the second connection terminal are connected to a same electronic component; and
a plurality of inner terminal portions disposed at a longitudinal end of at least one of each said first flexible wired circuit board and said second flexible wired circuit board, said inner terminal portions having inner terminals serving as connection terminals, said inner terminals being arranged in parallel along a widthwise direction and spaced apart from one another at a predetermined distance;
wherein the inner terminals connect to said at least one of said first flexible wired circuit board and said second flexible wired circuit board; and
wherein said second flexible wired circuit board comprises:
a plurality of longitudinally inwardly projected convex portions at a longitudinal inner end portion thereof.

18. The flexible wired circuit board according to claim 17, wherein said convex portions are formed between said inner terminal portions adjacent to each other in said widthwise direction.

19. The flexible wired circuit board according to claim 18, wherein each of said convex portions includes, at both widthwise sides thereof on a projection side, a plurality of slant portions formed to be gradually narrowed from a longitudinally outward portion to a longitudinally inner portion.

20. The flexible wired circuit board according to claim 19, further comprising:
a plurality of longitudinally inwardly projected projections formed at longitudinal inner ends thereon on said both widthwise sides.

21. The flexible wired circuit board according to claim 20, wherein each of said projections includes, at a widthwise outer portion thereof, a slant portion which is gradually narrowed toward a longitudinal inner end.

* * * * *

UNITED STATES PATENT AND TRADEMARK OFFICE
CERTIFICATE OF CORRECTION

| | |
|---|---|
| PATENT NO. | : 7,307,854 B2 |
| APPLICATION NO. | : 10/778167 |
| DATED | : December 11, 2007 |
| INVENTOR(S) | : Akinori Itokawa |

It is certified that error appears in the above-identified patent and that said Letters Patent is hereby corrected as shown below:

In the claims, Column 13, line 2, delete the last word "and" that appears at the end of the line.

Signed and Sealed this

Twenty-fourth Day of June, 2008

JON W. DUDAS
*Director of the United States Patent and Trademark Office*